United States Patent
Mudulodu

(10) Patent No.: US 11,689,349 B2
(45) Date of Patent: Jun. 27, 2023

(54) VARIABLE RATE SAMPLING IN A BLUETOOTH RECEIVER USING CONNECTION STATE

(71) Applicant: Silicon Laboratories Inc., Austin, TX (US)

(72) Inventor: Sriram Mudulodu, Hyderabad (IN)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 17/541,498

(22) Filed: Dec. 3, 2021

(65) Prior Publication Data

US 2022/0173881 A1 Jun. 2, 2022

Related U.S. Application Data

(62) Division of application No. 17/106,111, filed on Nov. 29, 2020, now Pat. No. 11,206,122.

(51) Int. Cl.
| | |
|---|---|
| *H04B 1/00* | (2006.01) |
| *H04L 7/00* | (2006.01) |
| *H04B 1/12* | (2006.01) |
| *H03M 1/12* | (2006.01) |

(52) U.S. Cl.
CPC .......... *H04L 7/0016* (2013.01); *H03M 1/126* (2013.01); *H04B 1/123* (2013.01)

(58) Field of Classification Search
CPC ........ H04L 7/0091; H04L 7/0079; H04B 1/00
USPC ....................................................... 375/355
See application file for complete search history.

(56) References Cited

U.S. PATENT DOCUMENTS

| | | | | |
|---|---|---|---|---|
| 6,704,349 B1 * | 3/2004 | Masenten | ............... | H04B 1/123 375/346 |
| 7,605,730 B2 * | 10/2009 | Tomioka | ............... | H03M 1/202 341/139 |
| 2005/0100119 A1 * | 5/2005 | Husted | ................... | H04B 1/123 375/346 |
| 2009/0091482 A1 * | 4/2009 | Oshima | ............... | H03M 1/1009 341/120 |
| 2013/0308735 A1 * | 11/2013 | Namdar-Mehdiabadi | .................... | H03L 7/0895 375/376 |
| 2015/0295608 A1 * | 10/2015 | Merlin | ................. | G06K 7/0008 455/63.1 |

* cited by examiner

*Primary Examiner* — Qutbuddin Ghulamali
(74) *Attorney, Agent, or Firm* — File-EE-Patents.com; Jay A. Chesavage

(57) ABSTRACT

A Bluetooth receiver has an RF front end which has a gain control input, the RF front end converting wireless packets into a baseband signal which is coupled to the input of an analog to digital converter (ADC). A clock generator provides a clock coupled to the ADC, and an AGC processor performs an AGC process to provide a gain which places the baseband symbols in a range that is less than 90% of the input dynamic range of the ADC. When in a connected state, the clock generator provides a clock which is slower than is required to complete the AGC process during a preamble interval, and the AGC process uses a few initial bits of the address field. The remaining bits of the address field is compared with the corresponding address bits of the receiver to determine whether to receive the packet.

19 Claims, 3 Drawing Sheets

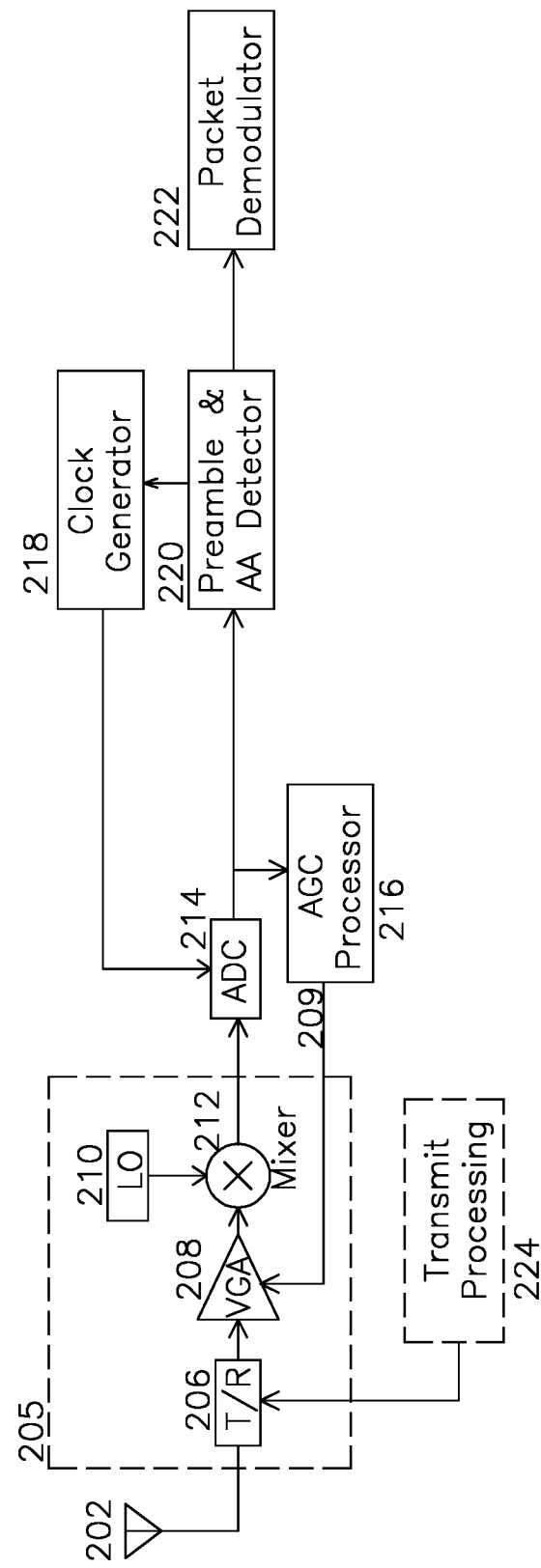

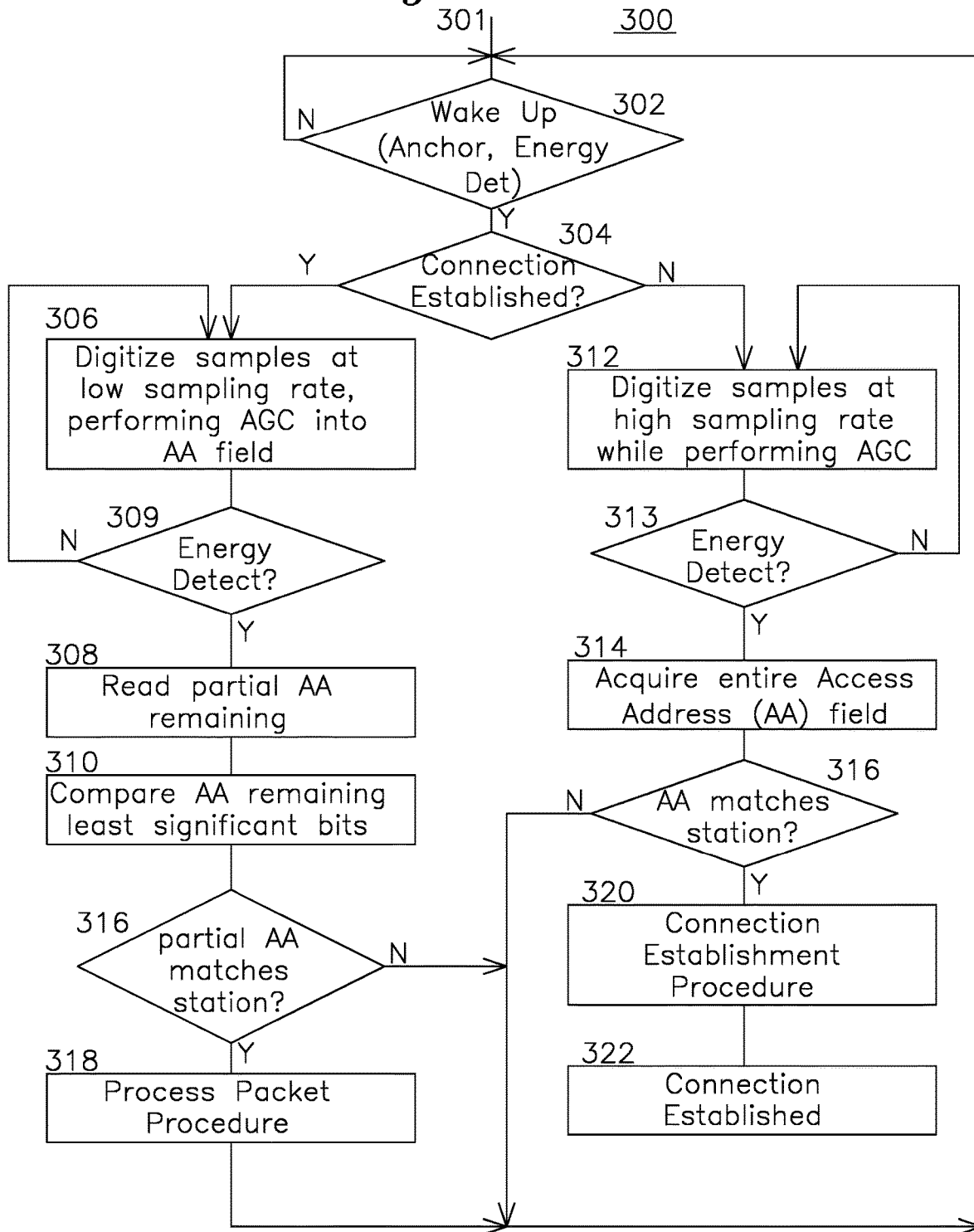

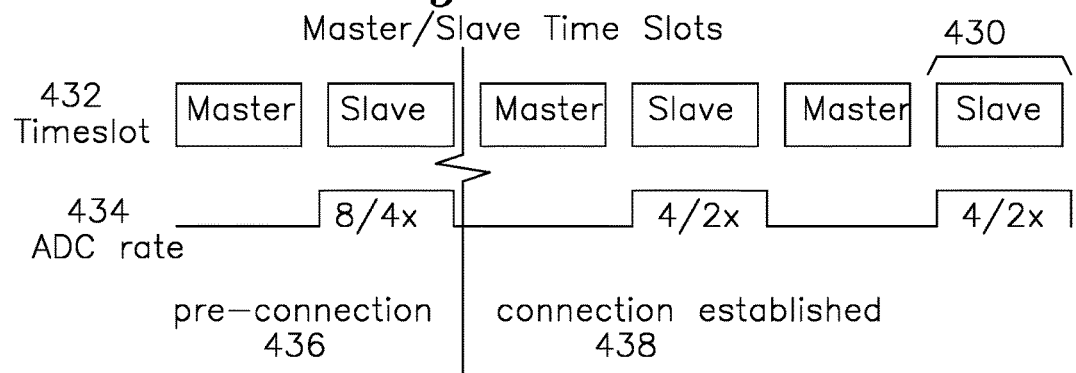
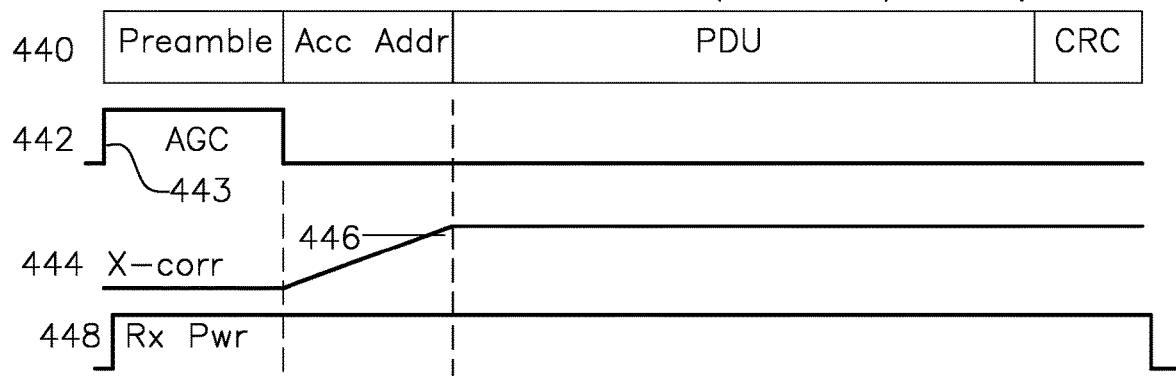
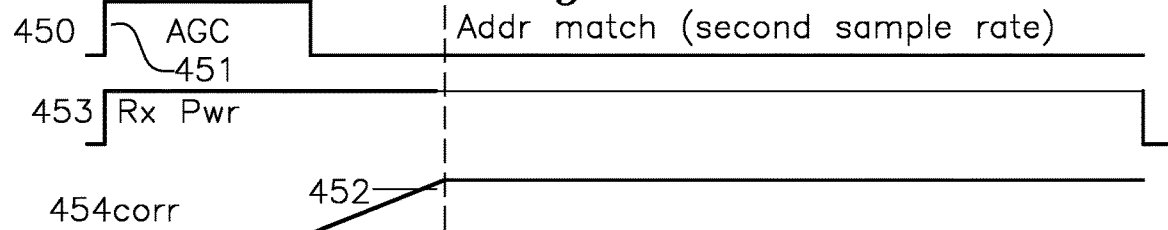
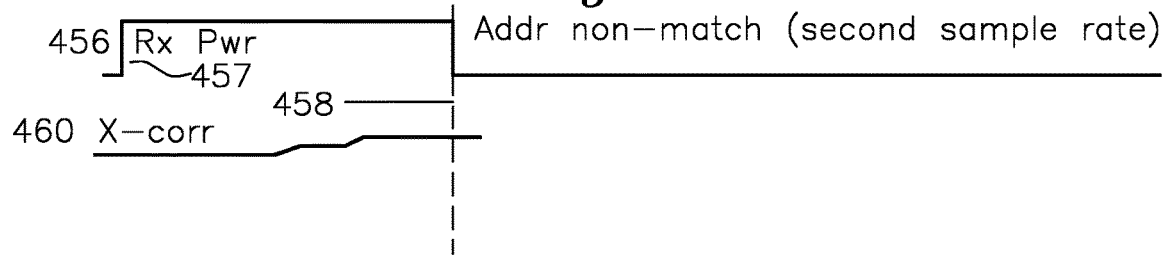

VARIABLE RATE SAMPLING IN A BLUETOOTH RECEIVER USING CONNECTION STATE

FIELD OF THE INVENTION

The present invention relates to an apparatus and process for a Bluetooth receiver. In particular, the invention relates to a power-saving multi-rate sampling front end for receiving Bluetooth packets which performs Automatic Gain Control (AGC) and packet sampling using an ADC sample rate which is dependent on a connection state.

BACKGROUND OF THE INVENTION

Bluetooth is a popular wireless communications protocol, whereby packets are transmitted in a piconet comprising a master station and multiple slave stations, referred to herein as "stations". The master station may transmit to one or more stations, each Bluetooth packet comprising a preamble part and a header part, one field of the header containing an Access Address (AA) which indicates whether the received packet is intended for the receiving station. According to the Bluetooth protocol as described in the Bluetooth Specification version 5.2 (available at www.Bluetooth.org), a Bluetooth station may have several different states with respect to a master, including a "connected" state and a "not connected" state, and references herein to a "Bluetooth Protocol" are directed to a communication protocol which is at least compatible with the Bluetooth Specification version 5.2, which is incorporated by reference.

The Bluetooth receiver comprises an RF front end which receives and amplifies the packet according to an applied gain input, a mixer which converts the wireless packet to baseband by mixing with a carrier frequency of 2.4 GHz, and an analog to digital (ADC) converter which samples the baseband RF at an ADC sample rate. One of the functions of the Bluetooth receiver is to examine the sampled dynamic range of the received packet, and apply increased or reduced gain in an iterative fashion until the ADC input signal being digitized is in a satisfactory dynamic range of the ADC. The process of iteratively adjusting the gain input of the RF front end is known as an Automatic Gain Control (AGC) process. After the AGC process completes, the packet Access Address (AA) field is read to determine whether the packet is destined for the station receiving it.

Because the receiver is unable to determine whether a packet is destined for the receiving station until the AA field is read and compared with the station address, it may be the case that significant power is consumed receiving packets which are not intended for the receiving station.

A consequence of performing the AGC process on every packet received is that excess power is consumed receiving packets which are not intended for the station, and the packet destination address is not known until the AA field of the packet is demodulated. It is desired to provide a receiver which consumes less power when receiving Bluetooth packets and determining whether the packet is destined for the receiving station than has been provided by the prior art.

OBJECTS OF THE INVENTION

A first object of the invention is an RF front end comprising a variable gain amplifier (VGA) coupled to incoming wireless packets, the VGA having a gain input, the RF front end producing a baseband output; an analog to digital converter (ADC) coupled to the baseband output, the ADC outputting digitized samples, the ADC sampling at an ADC sample rate to provide the digitized samples; an AGC processor receiving the digitized samples and setting the gain input to the VGA, the gain set to a range of 50% to 90% of an input dynamic range of an ADC for the digitized samples; a clock generator outputting an ADC clock for initiating the ADC samples; a preamble and access address (AA) detector; a connection state processor indicating either connected or not connected; the clock generator outputting the ADC clock at a first ADC sample rate when the connection state is not connected, the clock generating outputting the ADC clock at a second ADC sample rate which is less than the first ADC sample rate when the connection state is connected, the second ADC sample rate being insufficient for the AGC processor to complete setting the gain input during the preamble interval, the AGC processor operative to continue to set the gain input during at least a part of the AA; a cross correlator comparing a partial AA field comprising AA bits demodulated after the gain input is set to corresponding bits of a station address and indicating a match based on the comparison.

A second object of the invention is a process for a wireless receiver which receives a wireless packet having a preamble field and an access address (AA) field, the wireless receiver having a connection state of connected or not connected, the wireless receiver comprising an RF front end with a variable gain input and generating baseband symbols coupled to an analog to digital converter (ADC) which outputs digitized samples at an ADC sample rate controlled by an ADC clock, the process comprising: detecting a start of a wireless packet; when the connection state is connected, sampling the wireless packet at a first ADC sample rate sufficient to complete an AGC process which places the baseband symbols in a range of 25% to 90% of an ADC input dynamic range during a preamble interval; when the connection state is not connected, sampling the wireless packet at a second ADC sample rate slower than the first ADC sample rate and insufficient to complete the AGC process during an interval of the preamble field, and continuing to sample the wireless packet during an interval of the immediately subsequent Access Address (AA) field; after the AGC process is completed, demodulating remaining bits of the AA to form a partial AA, and comparing the partial AA with corresponding bits of a device address to determine whether to demodulate additional fields of the packet.

SUMMARY OF THE INVENTION

The present invention is directed to a power saving receiver for receiving wireless packets having at least a preamble field and an access address (AA) field. The receiver has an RF front end, an Analog to Digital Converter (ADC), an Automatic Gain Control (AGC) processor for setting a gain of the RF front end, a clock generator for generating a sample clock to the ADC to initiate ADC samples, and a preamble and AA detector. The RF front end has a variable gain amplifier and optionally a mixer for generating baseband signals, such as those compatible with a Bluetooth network protocol or an Adaptive Network Topology (ANT) network protocol as described in www.thisisant.com. The output of the RF front end is coupled to the ADC which digitizes the signals at an ADC sample rate determined by the clock generator. The receiver station maintains a connection state of either connected or not connected, for example to a Bluetooth or ANT master station. In the connected state, the clock generator outputs ADC sample clocks at a first ADC sample rate, and the clock generator outputs the ADC sample clock at a second ADC sample rate when in a connected state which is less than the first ADC sample rate. In the not connected state, the ADC sample rate is sufficient for the AGC processor to perform an AGC process during a preamble field interval. In the connected state, the second ADC sample rate is not sufficient to complete the AGC process during the preamble field interval, and the AGC process completes before the completion of the AA field and consumes some of the most significant bits of the AA field. The remaining bits of the AA after the AGC process is completed form a partial AA, and the partial AA bits are compared with the corresponding bits of a receiver address to determine whether to demodulate subsequent packet fields which follow the AA. Reduced power consumption results from the reduced ADC sample rate when the receiver is in a connected state. Additional power savings are realized if the receiver is operative to operate only during anchor intervals which are windows of time the receiver may operate which are specified at the time a connection is established. By using anchor intervals, the receiver greatly reduces the number of AA bits required to uniquely identify the receiver as the receiving station for packets, allowing the signal (or packet) to be sampled at a lower ADC sample rate, thereby reducing power consumption.

BRIEF DESCRIPTION OF THE DRAWINGS

FIG. 1 shows a prior art Bluetooth packet format.

FIG. 2 shows a block diagram of a receiver according to an example of the invention.

FIG. 3 shows a flowchart for a process for saving power according to an example of the invention.

FIG. 4A shows a plot for the time slot correspondence between a master and slave or station packet.

FIG. 4B shows waveforms of operation for the invention sampling at a first ADC sample rate where no connection is present.

FIG. 4C shows waveforms of operation for the invention sampling at a second ADC sample rate where a connection is present and address match is detected.

FIG. 4D shows waveforms of operation for the invention sampling at a second ADC sample rate where a connection is present and an address match is not detected.

DETAILED DESCRIPTION OF THE INVENTION

In the present patent application, the presentation of a nominal value x which is "approximately x" is understood to be within the range of +/−20% of x. Similarly, "on the order of x" is understood to include the range x/10 to 10x. References to the Bluetooth specification are to the associated version 5.2 protocol and its predecessors found at www.Bluetooth.org.

FIG. 1 shows a prior art Bluetooth packet having a data rate 1 Million bits per second (Mbps). A short one byte preamble 102 is followed by four bytes of access address (AA) 104, after which a variable length Protocol Data Unit (PDU) 106 is transmitted, followed by a three byte CRC 108 which verifies the integrity of the PDU 106.

FIG. 2 shows a Bluetooth receiver according to an example of the invention. An antenna 202 receives wireless Bluetooth packets, which are coupled to transmit/receive (T/R) switch 206, and, in sequence, Variable Gain Amplifier (VGA) 208, mixer 212 which mixes the received RF with a local oscillator (LO) 210 at 2.4 GHz, and the baseband symbols are coupled to an analog to digital converter (ADC) 214. Other variations and details of the RF front end 205 such as low pass anti-aliasing filters before the ADC 214, configurations for double conversion, or direct RF sampling are not shown for clarity in understanding the invention. An AGC processor 216 examines the dynamic range of the digitized samples from the ADC 214, and applies a gain control value 209 to VGA 208. The AGC process must complete during the interval of the single byte preamble 102 so that the Access Address 104 may be received so that preamble and AA detector 220 may examine the AA to determine whether the received packet is for the receiving station 200. The preamble and AA detector 220 may also estimate and correct the timing offset, frequency offset and other impairments introduced in the channel.

A clock generator 218 determines the sample rate of the ADC 214, and where the AA matches the current station address, the receive process continues and the remainder of the packet is coupled to the packet demodulator 222 to extract the PDU 106 and verify the CRC 108. The packet is rejected if the CRC does not match. If the AA does not match, the receiver powers down, and for the Bluetooth protocol, the receiver stays powered down until the expected arrival of the next packet at the assigned anchor interval for the station. Transmit processing 224 is shown in outline for reference, but is not in use during packet receive events of the present invention.

Where the communication protocol is Bluetooth, the 8-bit preamble 102 is transmitted at a bit rate of 1 million bits per second (1 Mbps). In one example of the invention, the preamble 102 is converted into 64 digital samples by ADC 214 (for an exemplar 8 MHz first ADC sample rate from clock generator 218), which are sufficient for the AGC process to converge and complete during the interval of the preamble 102. In an another embodiment, the 8-bit preamble is converted into 32 digital samples by ADC 214 (for an exemplar first ADC sample rate of 4 MHz from clock generator 218), which are available for the AGC process to converge during the preamble. After receiving the digital samples, the AGC processor 216 measures the digitized value range or maximum digital values of one or more digital samples, and iterates the gain value 209 until the samples are in the linear input range of the ADC 214, which can be a gain value that provides signal level at the input of the ADC which is in the range of approximately 25% to 90% of the linear input range of the ADC 214. For example, for a 12 bit ADC operating with an input range of 0 to 3.3V ($3.3V_{p-p}$), an ADC input signal range could correspond to the range from 825 mV peak to peak (p-p) for 25% of ADC input signal range to $2.97V_{p-p}$ for 90% of ADC input range. Other ranges may be 50% to 100% of ADC input signal range, or 25% to 100% of ADC input signal range as an end point for the AGC process which establishes the VGA gain input. In this manner, the AGC processor 216 iteratively measures ADC 214 output and applies an updated gain to VGA 208 until the ADC 214 output samples are brought to a predetermined level, such as a VGA gain 209 sufficient to cause the signal to be approximately 90% of the ADC available input range for linear conversion. This iterative gain control process typically does not require more ADC samples than the number of ADC samples taken during the preamble 102 interval when the preamble is 1 Mbps and the ADC sample rate is 4 MHz or 8 MHz. If the iterative process does not require more than the number of digital samples available in the preamble 102, then all bits of the access address 104 are available to be demodulated. In an example of the invention, the received access address is cross correlated with the device address, which accumulates a +1 value for each matching AA bit and device address bit pair and a 0 value for each non-matching bit pair. The first access address correlation threshold is set approximately equal to the length of the access address as all bits of the access address are received.

In an example of the invention, clock generator 218 provides an ADC sample rate which is connection state dependent during the preamble and AA fields. Where the station is not connected to a master, the clock generator 218 provides an ADC clock at a first ADC sample rate which is sufficient for the AGC process to complete during the preamble 102 interval, and the AGC process completes and a stable VGA gain value is present during the remainder of the packet for fields 104, 106, and 108. The station typically is in a 'not connected' state, such as prior to pairing with a master during the not connected state. The higher first ADC sample rate is maintained until a connection is established, after which the ADC sample rate drops to a lower ADC sample rate such as 1/2 or less. During the advertisement phase of the pairing process, the AA may be an initial value such as 0x8E89BED6 from the master station of the Bluetooth piconet, as described in the Bluetooth Specification.

However, when the station is connected to a master, the clock generator provides a lower ADC sample rate clock to ADC 214 to save power consumed by the ADC that would otherwise be wasted sampling at the higher ADC sample rate. In this state, the AGC process takes longer than a preamble 102 interval, and the AGC process continues into the Access Address 104 field. Sampling at a lower ADC sample rate saves power because the number of displacement current events associated with internal lines of the ADC changing state is reduced at lower rates compared to higher ADC sample rates. As the AGC process continues into the AA field interval, the result is that not all of the AA field is available for address decoding, and only the remaining part of the AA field (referred to as partial AA) after the AGC process completes is available for address decode. The AA is received with the most significant bit (MSB) of the AA field 104 first, and the least significant bit (LSB) of the AA field 104 last, so the partial AA comprises one or more LSB bits which provide sufficient station address uniqueness, particularly when the station AA is assigned sequentially by the master device. Therefore, an address comparison between the AA field bits which were received and the station address may be done, but with fewer bits in the AA and station address comparison. This generally does not pose a problem, as the likelihood of two stations with the same AA is low, and decreases with more LSB AA field 104 bits. Further, by using the remaining AA in combination with the receiver waking up only at anchor intervals, it is possible to use far fewer of the AA bits than the complete field. For example, the AA field is 32 bits, but for 7 stations connected to a master and sequential address assignment, only 3 or 4 AA field bits are required to uniquely identify one of the 7 stations. For randomly assigned AAs, the likelihood of a duplicate station is 7 in 1024 for 10 bits of the 32. Additionally, a protocol may be adapted where a minimum number of AA bits is used based on the number of stations in the piconet, and when an error occurs that is likely a duplicate station address response error, the station can use an increasing number of partial AA bits until the error no longer occurs, reducing the number of AGC iterations or changing the ADC sample rate to complete AGC earlier to provide an earlier AGC process completion and a greater number of bits in the partial AA.

In this manner, the ADC clock generator outputs an ADC clock at a first ADC sample rate when the receiver is not in a connected state, and the ADC clock generator outputs an ADC clock at a second ADC sample rate which is lower than the first ADC sample rate when the receiver is in a connected state.

FIG. 3 shows a process flowchart for the receiving station 200 of FIG. 2. Process 300 is entered 301 at the start of an anchor point or assigned time slot, or by a detected energy increase or a change of energy. The process next checks to see if a connection is established 304. If a connection is not established, the ADC clock generator 218 outputs a first ADC sample rate 312 which is a comparatively high ADC sample rate compared to a second ADC sample rate used 306 when a connection is not present. When a connection was not previously established, step 312 provides digitized samples of the ADC, which are used by the AGC processor 216 to iteratively set the receiver gain level. The digitized samples from the ADC may also be used to detect increase in energy or change in energy (to detect the start of a packet). In an alternate embodiment, the AGC process 312 is triggered after detecting the start of the packet or increase in received energy or energy detection 313. The AGC process 312 completes and the AA field is next read at step 314 if energy increase 313 is detected. If the AA matches 316 the receiving station 200 address and a Bluetooth connection request is received, an associated process such as a connection establishment procedure 320 may be performed, which changes the connection status to "connected" 322. In an example embodiment, if the AA match 316 is not found, the receiver goes back into a sleep mode until the start of the next time slot or anchor point 302. Other processes may be performed, depending on the nature of the packet, other than a connection request.

When a connection is established from a previous connection establishment event, the receiver wakes up 302 in anticipation of receiving a subsequent packet, or a packet arrival is detected such as by energy level increase or other means. In this case, the previously established connection leads to step 306, where the samples are digitized at the second ADC sample rate which is slower than the first ADC sample rate during step 306 during which time the AGC process is performed while performing an energy detect 309 to ascertain an increase in RF energy associated with a Bluetooth packet reception. In one example of the invention, the second ADC sample rate is 1/2 or less of the first ADC sample rate. Upon completion of the AGC process in step 306 and detection (or increase) of RF energy indicating packet reception 309, the final gain level 209 is applied to the VGA 208. Since the slower ADC clock rate has delayed the AGC process into the AA field, during step 308 the remaining AA bits are read. As the second ADC sample rate is known, and a fixed number of AGC iterations are typically used, the number of bits of the partial AA field may be known, or the partial AA field bits which are received may be framed with respect to the PDU 106 field. A partial comparison of the received bits of the AA field with the corresponding partial station address bits is performed 316, and if the corresponding partial AA field bits match, the packet processing is performed 318, otherwise the process terminates and returns to the packet detect step 302. In an embodiment, if the received partial AA does not match with the corresponding bits of the station address, the receiver returns to a sleep state 301 until the start of the next time slot or anchor point.

FIGS. 4A, 4B, 4C, and 4D show example waveforms for examples of operation for the preceding FIGS. 2 and 3. In an example embodiment, where the protocol of the communication is Bluetooth, the start of a connection between a master device and slave device is known as an anchor point, which establishes periodic transmission and reception time slots with respect to the anchor point during which the receiver may be powered on, and powered off at other times. After the connection is established, a slave device connected to a master device wakes up (has power applied so it is functional) shortly before its anchor point (corresponding to a time slot for slave packet reception) for receiving its packet from the master device. Each slave device connected to the master device has its own unique anchor point. Each slave device wakes up at its particular anchor point to receive its packet from the master device, transmits its packet and goes back to sleep until its next anchor point. The interval time between two anchor points is called a connection interval. The master device and slave device hop to a different frequency channel after one connection interval. The selection of the channel is based on the channel selection algorithm. In this manner, the probability of a slave's packet to be present at another slave's anchor point and, in another slave's selected frequency channel and to have similar access address is greatly reduced, since communication with other stations on the piconet occur at different anchor point intervals specific to those stations. In such a case, the AGC processor 216 is allowed to converge beyond the preamble 102 and into access address 104 portion of the packet, such that the remainder of access address is demodulated and is sufficient for comparison with the corresponding bits of the station address to determine whether the packet is intended for the receiving station. In an embodiment, the access address correlation threshold in the connected state is based on a number of frequency channels used for hopping supported by the communication system.

In another embodiment, the communication system may be an ANT (or ANT+) Gaussian Frequency Shift Keying (GFSK) protocol, which is closely related to BLE. The ANT protocol from Dynastream Innovations company is described in the online specifications found at www.thisisant.com.

FIG. 4A shows the sequence of time slots during which a remote master is transmitting and the slave receiving station 200 is receiving packets in a series of canonical time slots. The interval 436 represents a pre-connection interval, and the interval 438 indicates a connection present interval. In the not connected state 436 of FIG. 4A, the ADC sample rate 434 may be at 8× (8 times the data rate of the signal such as 8 Mhz sample rate for a 1 Mbps data rate) or 4× (4 times the data rate of the signal such as 4 Mhz sample rate for a 1 Mhz data rate). In the connected state 438 of FIG. 4A, the nominal ADC sample rate may be 4× (4 times such as 4 Mhz) or 2× (2 times or 2 Mhz) the data rate of the signal for an example 1 Mbps data rate.

FIG. 4B shows a plot of signals for the receiving station 200 in a pre-connection (not connected) state, with the incoming packet field sequence shown in 440, and AGC being iteratively converged during the preamble interval, and a station address match to the Access Address determined such as by cross correlation of the bits of the AA to the station address, which increases until threshold 446 is reached, indicating a sufficient percentage of the AA bits match, typically finishing when all of the AA bits are included in the cross correlation. Waveform 448 indicates that receiver power remains applied throughout, since the address matched.

FIG. 4C shows the case where a connection has been established, and the second ADC sample rate is applied to the ADC. In this case, the AGC is performed as shown by 450, which takes a longer time to complete, and continues into the AA field. However, the remaining bits of the AA are cross-correlated with the bits of the receiving station 200 address, and if a sufficiently high number of the bits match in a cross correlation result, a threshold 452 is crossed indicating an address match, and the packet processing continues as before FIG. 4D shows a failure to match address in the connected state, the packet is detected, the AGC process occurs and extends into the AA as before, however the cross correlation result 460 never exceeds the threshold 458, and receiver power 456 is removed when this failure to match AA is detected.

The present examples are provided for illustrative purposes only, and are not intended to limit the invention to only the embodiments shown.

I claim:

1. A process for a wireless receiver which receives a wireless packet having a preamble field and an access address (AA) field, the wireless receiver having a connection state of connected or not connected, the wireless receiver comprising an RF front end with a variable gain input and generating a baseband signal coupled to an analog to digital converter (ADC) which outputs digitized samples at an ADC sample rate, the process comprising:
   when the connection state is not connected, sampling the wireless packet at a first ADC sample rate which places the baseband signal in a range of 25% to 90% of an ADC input dynamic range during a preamble interval;
   when the connection state is connected, sampling the wireless packet at a second ADC sample rate slower than the first ADC sample rate and which does not place the baseband signal in a range of 25% to 90% of the ADC input dynamic range during an interval of the preamble field, and continuing to sample the wireless packet during an interval of the AA field;
   determining for an interval of time that the wireless packet has been received by examination of a signal level or an increase in signal energy and powering down the wireless receiver if the wireless packet has not been received;
   after the AGC process is completed, demodulating remaining bits of the AA to form a partial AA, and comparing the partial AA with corresponding bits of a station address to determine whether to demodulate additional fields of the wireless packet.

2. The process of claim 1 where the second ADC sample rate is approximately half of the first ADC sample rate.

3. The process of claim 1 where the wireless packet is at least one of an ANT protocol wireless packet or a Bluetooth protocol wireless packet.

4. The process of claim 1 where comparing the remaining bits of the AA with corresponding bits of the device address comprises a cross correlation.

5. The process of claim 4 where the comparison is true if at least 90% of the remaining bits of the AA match the corresponding bits of the device address.

6. A process for a wireless receiver comprising an RF front end with a variable gain input and generating a baseband signal coupled to an analog to digital converter (ADC) which outputs digitized samples at an ADC sample rate, the wireless receiver maintaining a connection state of connected or not connected, the process comprising:
   receiving a wireless packet having a preamble field and an access address (AA) field;

when the connection state is not connected, the ADC sampling the wireless packet at a first ADC sample rate and adjusting the variable gain input until the baseband signal is in a range of 25% to 90% of an ADC input dynamic range during a preamble interval which occurs during the received wireless packet having the preamble field;

when the connection state is connected, sampling the wireless packet at a second ADC sample rate slower than the first ADC sample rate which does not place the baseband signal in a range of 25% to 90% of an ADC input dynamic range during an interval of the preamble field, and continuing to sample the wireless packet and perform the AGC process during an interval of the AA field;

determining that the wireless packet has been received by examination of a signal level or an increase in signal energy;

powering down the wireless receiver when the determination is that the wireless packet has not been received;

after the AGC process is completed, demodulating remaining bits of the AA to form a partial AA, and comparing the partial AA with corresponding bits of a station address to determine an address match;

demodulating additional fields of the packet when the partial AA matches corresponding bits of the station address.

7. The process of claim 6 where the second ADC sample rate is approximately half of the first ADC sample rate.

8. The process of claim 6 where the wireless packet is at least one of an ANT protocol wireless packet or a Bluetooth protocol wireless packet.

9. The process of claim 6 where comparing the partial AA with corresponding bits of the station address is a cross correlation.

10. The process of claim 9 where comparing the partial AA is true if at least 90% of the partial AA matches the corresponding bits of the station address.

11. The process of claim 6 where the second sampling rate comprises maintaining a previous gain input value.

12. The process of claim 6 where the connection state is connected if a Bluetooth master device is associated with an address corresponding to the station address of the wireless receiver.

13. A process for a wireless receiver receiving wireless packets comprising a preamble field, an access address (AA) field, and data fields, the process operative on a wireless receiver having either a connected state or a not connected state, the wireless receiver generating digitized samples of a received packet at a first sample rate or at a second sample rate, the wireless receiver having an adjustable gain and a demodulator for extracting data from received wireless packets, the process comprising:

sampling a received wireless packet at the first sample rate greater than the second sample rate when the wireless receiver is in a not connected state;

sampling a received wireless packet at the second sample rate less than the first sample rate when the wireless receiver is in a connected state;

the second sample rate operative during an AGC process for changing the adjustable gain during an interval of the preamble field to place the digitized samples in an amplitude range of 25% to 90% of an ADC input dynamic range, the AGC process continuing to adjust a gain of the wireless receiver during part of the access address field, the demodulator comparing a remaining part of the received access address field with corresponding bits of a station address to determine an address match, the demodulator demodulating the data fields when an address match occurs, and powering down the wireless receiver when the address match does not occur;

the first sample rate being sufficient to complete an AGC process on the received packet during an interval of the preamble field.

14. The process of claim 13 where the second ADC sample rate is approximately half of the first ADC sample rate.

15. The process of claim 13 where the wireless packet is at least one of an ANT protocol wireless packet or a Bluetooth protocol wireless packet.

16. The process of claim 13 where comparing the remaining part of the received access address comprises a cross correlation.

17. The process of claim 16 where comparing the remaining part of the receiver access address is true if at least 90% of the remaining bits of the AA match corresponding bits of the device address.

18. The process of claim 13 where the wireless receiver connection state is the connected state after a complete or partial match between the station address and received access address occurs.

19. The process of claim 13 where the receiver connection state is the connected state if an associated Bluetooth master device is associated with a station address corresponding to the wireless receiver.

* * * * *